united States Patent [19]

Bacchi et al.

[11] Patent Number: 5,331,458
[45] Date of Patent: Jul. 19, 1994

[54] COMPACT SPECIMEN INSPECTION STATION

[75] Inventors: Paul E. Bacchi; Paul S. Filipski, both of Novato, Calif.

[73] Assignee: Kensington Laboratories, Inc., Richmond, Calif.

[21] Appl. No.: 405,343

[22] Filed: Sep. 11, 1989

[51] Int. Cl.$^5$ .............................................. G02B 21/26
[52] U.S. Cl. ...................................... 359/393; 359/391
[58] Field of Search ................................ 350/507–532; 356/399–408; 250/423 F; 414/404, 425, 414, 225; 359/391–398, 430

[56] References Cited

U.S. PATENT DOCUMENTS 4,680,061  7/1987  Lamont, Jr. .......................... 250/398
4,784,481  11/1988  Wuerfel ................................ 350/529
4,886,412  12/1989  Wooding et al. ..................... 414/416

FOREIGN PATENT DOCUMENTS 167817  12/1987  Japan .................................... 359/391
4240  12/1983  World Int. Prop. O. .

OTHER PUBLICATIONS

Reference Form PLO 52586 Optical Specialties, Inc.
References by Nikon (Oct. 1984–Apr. 1987).
Reference publication No. 831011 by Leitz (Jan. 1985).
Reference FN: WPD003 by KLA Instruments Corporation (Dec. 12, 1988).
Pieter Burggraaf, "Auto Wafer Inspection Tools for Your Process Problems" *Semiconductor International* (Dec. 1988).
Kensington Wafer Handler, Specification Sheet, Kensington Laboratories, Inc., 750 National Court, Richmond, CA 94804.

*Primary Examiner*—Scott I. Sugarman
*Assistant Examiner*—Thong Nguyen
*Attorney, Agent, or Firm*—Stoel Rives Boley Jones & Grey

[57] ABSTRACT

The present invention is a compact specimen inspection station (10) that processes vertically oriented specimens. Specimen storage, transport, and inspection components (26, 28, and 30) are all mounted to a vibration-damped support structure (14) and are designed to handle specimens (34) positioned with a generally vertical orientation. The station is designed to minimize undesirable specimen motion and contamination caused by an operator (42). The station is also equipped with a microscope (32) and a display monitor (36) that provide a real image and a video image, respectively, of a microscopic region of the specimen under inspection. The station is equipped with failsafe mechanisms (176 and 182) that prevent the dropping of a specimen during an electrical power failure or a vacuum pressure loss.

20 Claims, 7 Drawing Sheets

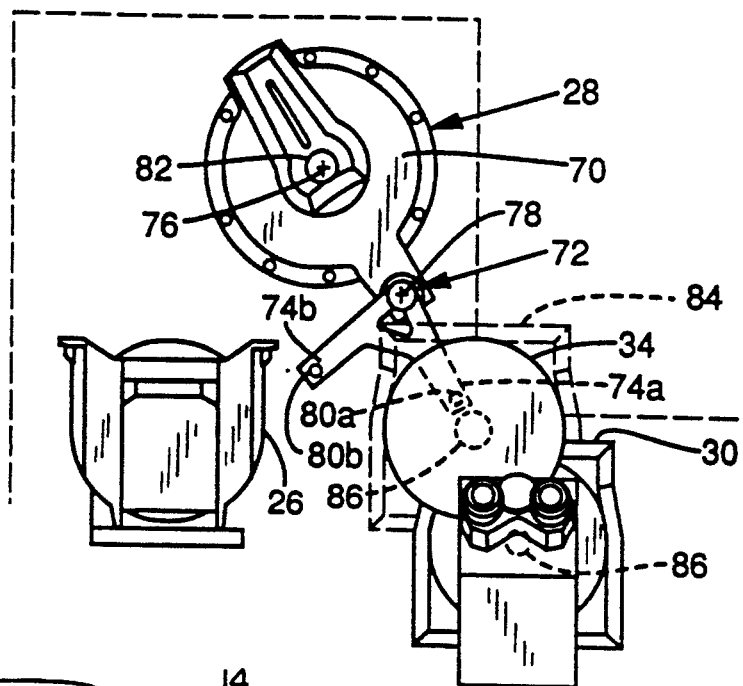
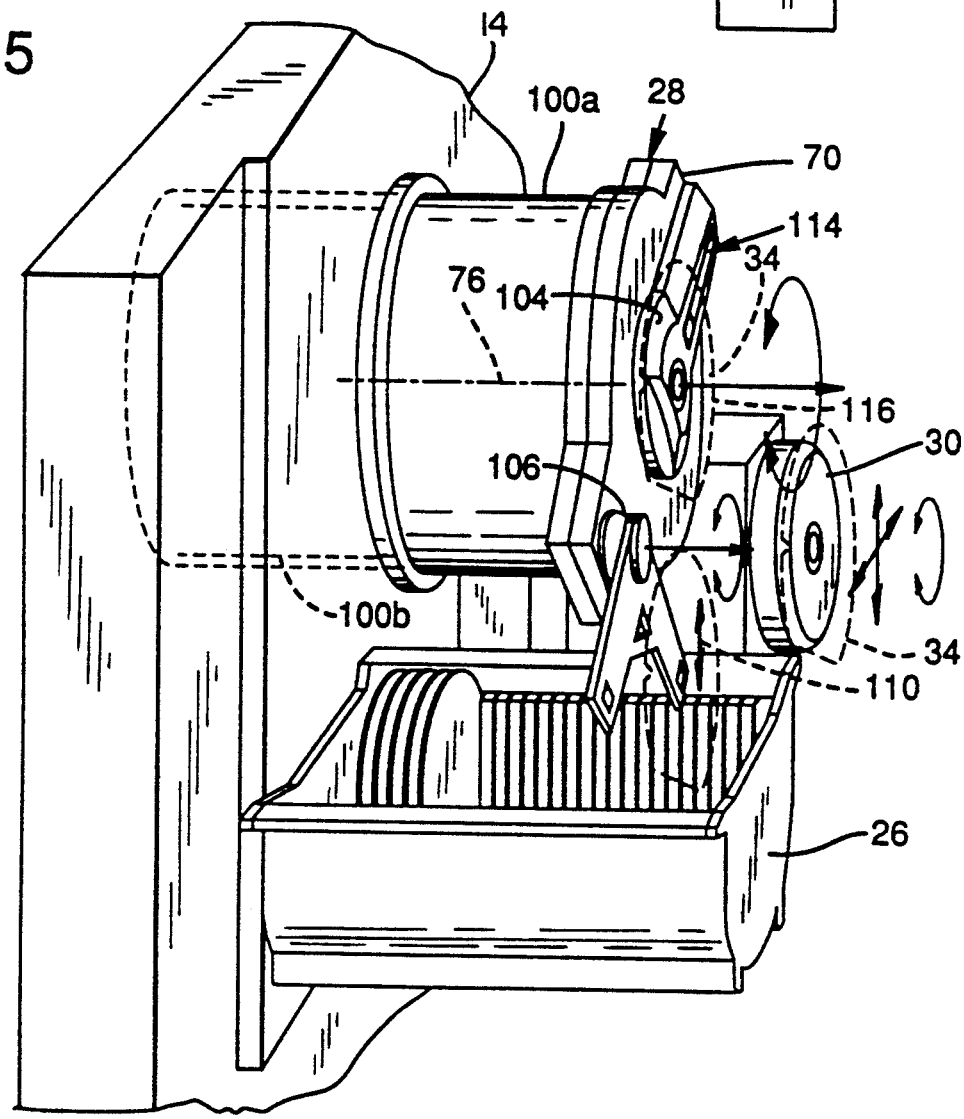

COMPACT SPECIMEN INSPECTION STATION

TECHNICAL FIELD

The present invention relates to specimen inspection stations and, in particular, to a specimen inspection station in which the specimen is stored and inspected while positioned in a generally vertical orientation to facilitate a compact arrangement of the inspection system components.

BACKGROUND OF THE INVENTION

A conventional semiconductor wafer fabrication process entails detection and inspection of defects in the patterned surface of a specimen wafer. The in-process inspection for defects is typically accomplished with the use of an operator-controlled inspection station that includes a microscope and a television-type display monitor for viewing the minute detail of the patterned surface in a small region of the wafer.

The wafer is typically secured by vacuum pressure or other means to an X-Y translation stage that moves the wafer in a horizontal plane. The microscope optically communicates with a fixed region in space above the X-Y stage, the fixed region being defined by the field of view of the microscope objective. The X-Y stage moves the wafer to selectable positions in the horizontal plane to present different regions of the wafer within the field of view of the microscope objective. A video camera optically coupled to the microscope provides video signals representative of the region of the wafer presented to the microscope objective. The operator is, therefore, able to select a region of the wafer for inspection and view the region through the microscope eyepiece or a video image of the region displayed on the monitor.

There are several design considerations affecting the physical layout of and equipment used in a specimen inspection station. Such design considerations stem primarily from the presence of an operator and her or his movements during normal use of the inspection station.

First, the operator uses a keyboard to manually enter data delivered to a computer that generates commands to operate the X-Y stage and perform other functions necessary to locate, identify, and classify defects in the specimen wafer under inspection. Vibration isolation is, therefore, sometimes used to prevent normal operator movements from affecting the stability of the wafer region positioned within the field of view of the microscope objective.

Second, human contamination introduced by the operator is a significant contributor to in-process wafer defects. To combat this problem, special equipment providing a clean room environment is sometimes used.

Third, the ergonomics of coordinating the placement of operator equipment such as the keyboard, the microscope, and display monitor for operator convenience and ease of use dictates the layout and size of a work space needed for the specimen inspection station components. The size of the specimen that is to undergo inspection can also affect the size of the work space.

Finally, the horizontal disposition of a very large area specimen on the X-Y stage can cause the specimen to deflect under its own weight and thereby necessitate the use of a stage having a large surface area to reduce the amount of stress borne by the specimen during inspection.

SUMMARY OF THE INVENTION

An object of the present invention is to provide a compact specimen inspection station.

Another object of the invention is to provide such an inspection station that minimizes specimen motion induced by operator-caused vibration.

A further object of the invention is to provide such an inspection station whose station component layout reduces the likelihood of human contamination of the specimen under inspection.

Still another object of the invention is to provide an inspection station that features good ergonomic design, occupies a compact work space, and exerts less stress on the specimen under inspection.

The present invention is a specimen inspection station whose components are oriented so that the specimen is stored, transported, and inspected while positioned in a generally vertical orientation. The present invention is described herein only by way of example with reference to a semiconductor wafer defect inspection station.

The inspection station components include a wafer storage cassette positioned on a horizontal shelf so that multiple semiconductor wafers can be stored spaced apart from one another with their patterned surfaces oriented vertically. Each wafer is stored in a different one of the slots of the storage cassette. The shelf is attached to a vibration-damped support structure to which all of the specimen storage, transport, and inspection components are mounted. An automated wafer handler and an X-Y translation stage are mounted to an upright rear member of the support structure. The wafer handler transports a selected one of the wafers from its slot in the storage cassette to the X-Y stage. The wafer handling surfaces of the wafer handler and X-Y stage lie in vertical planes. The X-Y stage holds the wafer and translates it in a vertical plane so that different regions of the wafer surface lie within the field of view of a microscope objective for inspection.

The wafer handler and the X-Y stage are connected to a vacuum pressure system for holding the wafer and thereby maintaining its vertical orientation during transportation and inspection. The wafer handler has a rotatable platform to which a paddle structure that includes a pair of paddles is mounted for rotation at an angular velocity independent of that of the platform. The coordinated rotational motion of the platform and paddle structure in cooperation with a telescopic extension capability of the wafer handler allows a paddle to lift a selected one of the wafers vertically from its slot in the storage cassette and position the selected wafer on the platform. Vacuum pressure delivered to the paddle and platform secure the wafer to them.

The wafer handler first performs an edge scan of the wafer to determine its center offset and angular orientation in the vertical plane. Using the paddle, the wafer handler then transfers the wafer in a desired angular orientation to the wafer handling surface of the X-Y stage. Vacuum pressure delivered to the X-Y stage secures the wafer to the X-Y stage. In response to an operator command, the X-Y stage moves a selected region of the wafer into the field of view of a microscope objective, which is positioned near the patterned surface of the wafer. The microscope is mounted to the base of the X-Y stage on the upright member and is positioned so that the eyepiece through which the operator looks is located a horizontal distance away from the wafer surface, thereby decreasing the likelihood of operator contamination during inspection. A video camera is optically coupled to the microscope to generate video signals representative of the image seen by the operator. A display monitor supported on the upright member provides the operator with a conveniently placed video display image of the region within the field of view of the microscope objective.

The above-described component layout exhibits superior ergonomic design characteristics while providing a compact inspection station that minimizes the likelihood of operator contamination and eliminates deflection forces on the wafer resulting from its own weight.

In addition, the inspection station includes failsafe systems for ensuring that the wafer under inspection is not dropped in the event of electrical power failure or vacuum pressure loss.

Additional objects and advantages of the present invention will be apparent from the detailed description of a preferred embodiment thereof, which proceeds with reference to the accompanying drawings.

BRIEF DESCRIPTION OF THE DRAWINGS

FIGS. 4A, 4B, and 4C are schematic diagrams showing the orientation of the wafer handler as a wafer is, respectively, acquired from and returned to the storage cassette, centered on the wafer handler, and delivered to the X-Y stage for inspection;

FIG. 5 is a fragmentary isometric view showing the wafer handler, X-Y stage, and storage cassette arranged to accommodate a wafer positioned in a vertical orientation and shown in phantom in different locations in the inspection station;

DETAILED DESCRIPTION OF PREFERRED EMBODIMENT

Figure 1:
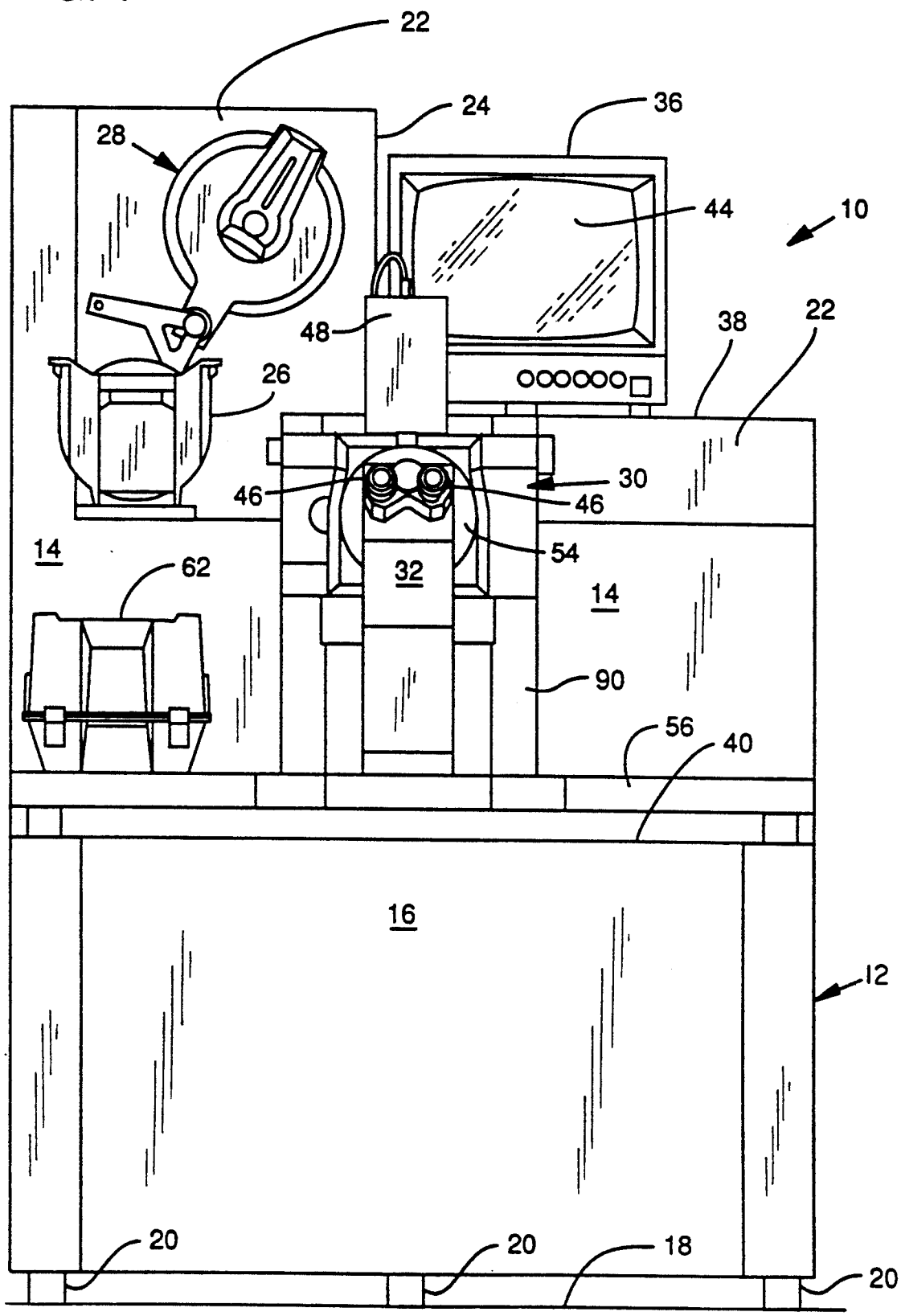
FIG. 1 is a frontal elevation view of the specimen inspection station of the present invention.
Figure 2:
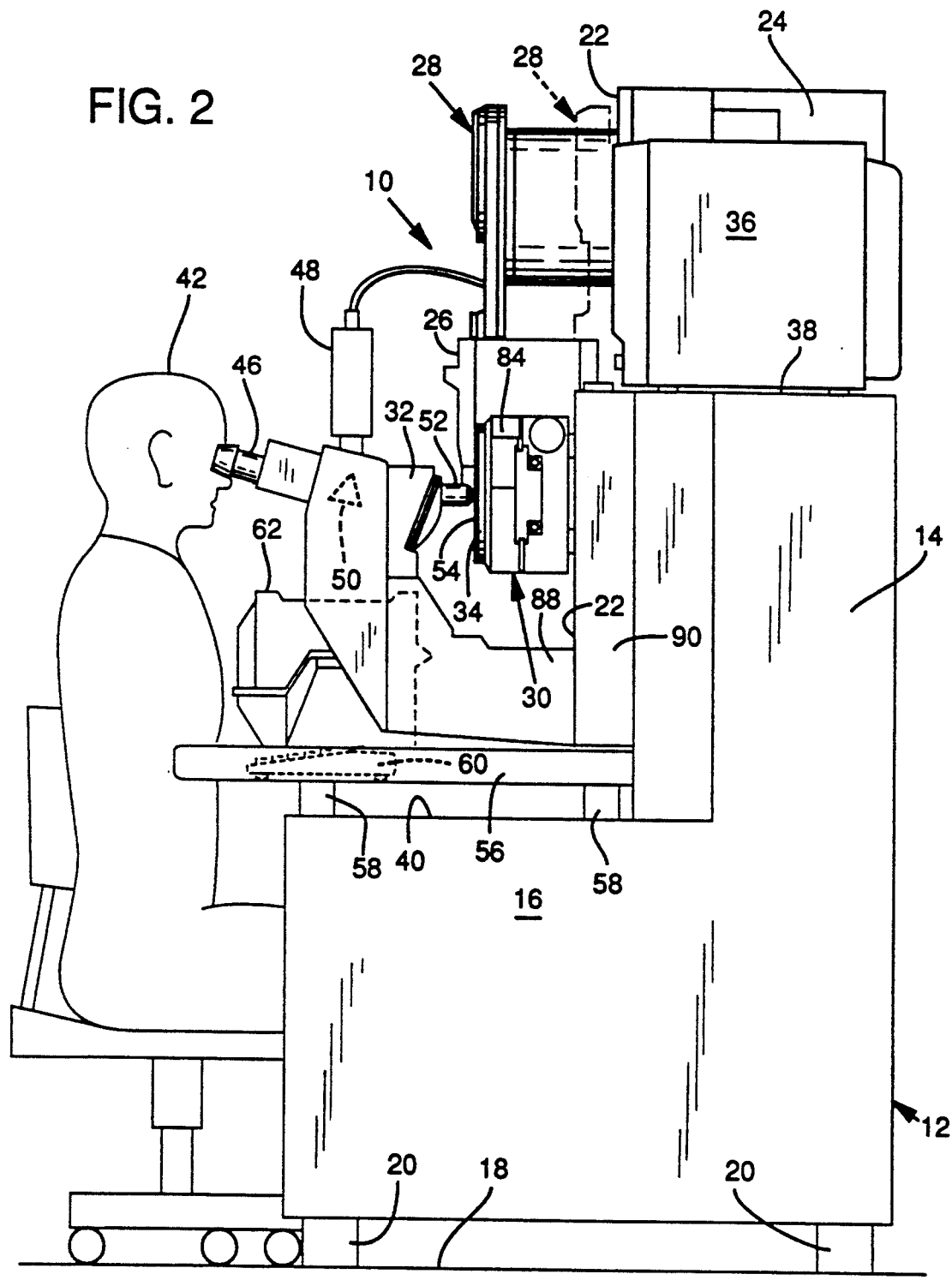
FIG. 2 is a right side elevation view of the specimen inspection station shown in FIG. 1.
Figure 3:
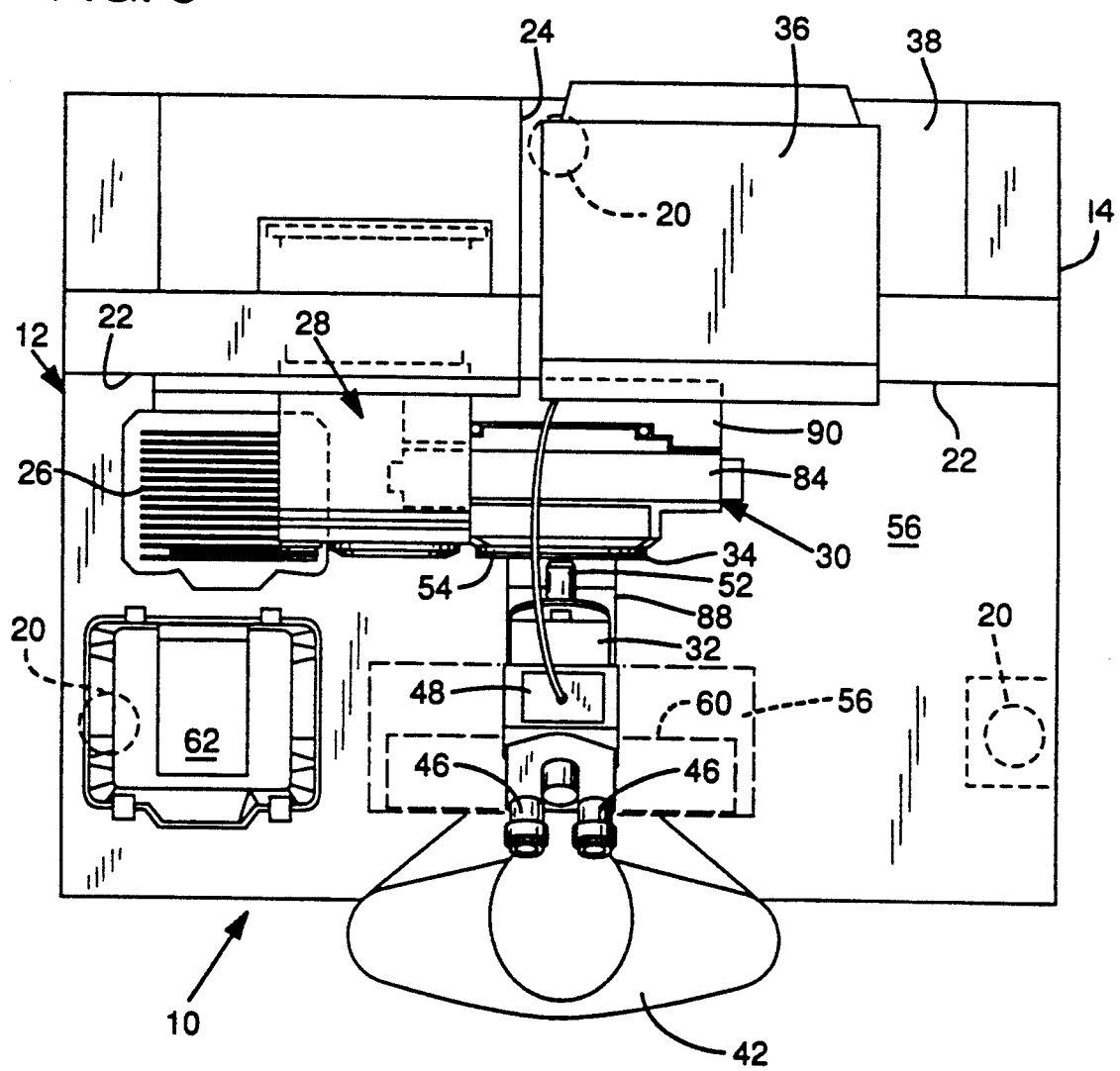
FIG. 3 is a plan view of the specimen inspection station shown in FIG. 1.

With reference to FIGS. 1-3, specimen inspection station 10 includes an internally vibration-damped support structure 12 having an upright rear member 14 and a front bench member 16. An example of such a support structure is an RS Series table manufactured by Newport Corporation, Fountain Valley, Calif. Support structure 12 is of integral construction design and is supported on a floor 18 by three vertically adjustable feet 20, two in the front and one in the rear.

Rear member 14 has a vertical planar front surface 22 with a stepped upper surface 24. A semiconductor wafer storage cassette 26, an automatic robotic wafer handler 28, an X-Y translation stage 30, and a binocular microscope 32 are secured to front surface 22 in a compact arrangement that facilitates the transfer and inspection of a semiconductor wafer 34 positioned in a generally vertical orientation, as will be further described below.

A television-type image display monitor 36 rests on a ledge 38 of upper surface 24. The height of ledge 38 above a planar horizontal surface 40 of bench member 16 provides an operator 42 with a direct view of the display surface 44 of monitor 36 when operator 42 is seated in front of the eyepiece 46 of microscope 32. A video camera 48 coupled to microscope 32 by way of an optical beamsplitter 50 delivers to display monitor 36 video signals representing the image within the field of view of an objective 52 of microscope 32. Microscope 32 and display monitor 36 provide operator 42 with, respectively, a direct image and a video display image of defects in the region of the patterned surface 54 of wafer 34 that is within the field of view of microscope objective 52.

A shelf 56 is supported above surface 40 by four extensible mounting legs 58 that are releasably secured within bench member 16. Legs 58 are vertically adjustable within bench member 16 to provide shelf 56 with an adjustable height. A keyboard 60 and a storage box 62 together with any other operator equipment lie on shelf 56. Operator 42 uses keyboard 60 to enter commands and other data to a microprocessor-based computer (not shown) that controls the operation of inspection station 10. Storage box 62 holds an extra storage cassette for later use with inspection station 10.

Figure 4A:
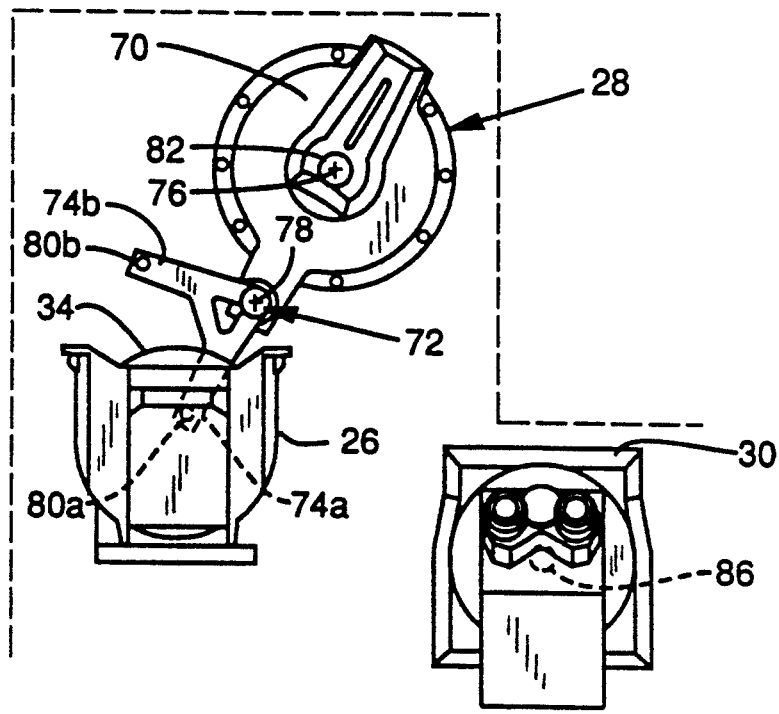
Figure 4B:
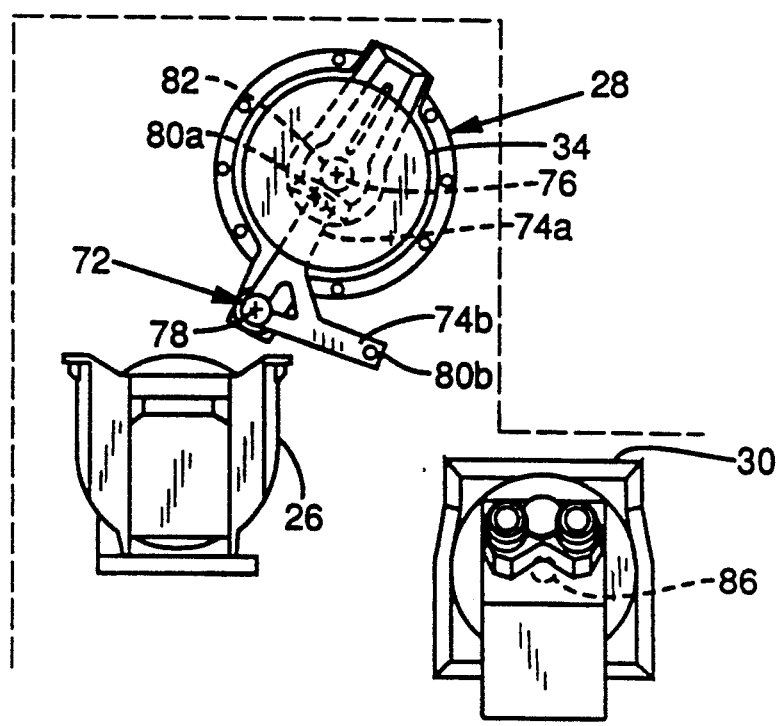

An inspection operation is carried out with the use of inspection station 10 as described below. FIGS. 4A, 4B, and 4C are schematic diagrams showing the orientation of wafer handler 28 as a wafer 34 is, respectively, acquired from and returned to storage cassette 26, centered on wafer handler 28, and delivered to X-Y stage 30 for inspection. With reference to FIGS. 1-3 and 4A-4C, wafer handler 28 has a rotatable specimen handling platform 70 to which a paddle structure 72 having a pair of paddles 74a and 74b is rotatably mounted. Platform 70 and paddle structure 72 rotate independently of each other about a horizontal central axis 76 and a horizontal paddle axis 78, respectively. Platform 70 is positionable along the length of central axis 76 to position paddle structure 72 to engage a selected one of the wafers 34 stored in storage cassette 26. Storage cassette 26 is clamped to rear member 14 so that the wafers 34 stored therein are vertically oriented and can be removed by lifting them straight up and out of storage cassette 26.

The coordinated rotational motion of platform 70 and paddle structure 72 causes paddle 74a to contact wafer 34, as shown in FIG. 4A, and with vacuum pressure delivered through a paddle vacuum chuck 80a, to acquire wafer 34 and position it over a central vacuum chuck 82 on platform 70. The application of vacuum pressure to central vacuum chuck 82 secures wafer 34 in place in a vertical orientation to platform 70. Paddle 74a then moves out from behind wafer 34, i.e., out of the space between wafer 34 and platform 70.

Platform 70 rotates 360 degrees to optically scan and compute a polar coordinate map of wafer 34 to determine the locations of its center and flat. Upon determining the center location, paddle 74a moves back behind wafer 34, as shown in FIG. 4B, and with vacuum pressure delivered through paddle vacuum 80a acquires wafer 34. The coordinated rotational motion of platform 70 and paddle structure 72 causes paddle 74a to deliver wafer 34 to an upper stage 84 of X-Y translation stage 30, which is shown in FIG. 4C displaced in phantom from the nominal position of FIGS. 4A and 4B to indicate the wafer receiving position of X-Y stage 30. The delivery path followed by wafer 34 places it in a desired orientation over a vacuum chuck 86 on X-Y stage 30. Vacuum pressure delivered to vacuum chuck 86 secures wafer 34 in place in a vertical orientation to X-Y stage 30. The known placement of wafer 34 is accomplished by computing the rotational motions of platform 70 and paddle structure 72 needed to deliver wafer 34 in its computed orientation from platform 70 to its desired orientation on X-Y stage 30. A vacuum pressure control system ensures that wafer 34 is always under vacuum pressure during the placement and removal of wafer 34 on vacuum chuck 82 and the transfer of wafer 34 between wafer handler 28 and X-Y stage 30 as described below in greater detail.

Microscope 32 includes a body member 88 that is bolted directly to a base member 90 of X-Y stage 30 on rear member 14. Body member 88 is configured such that microscope objective 52 is positioned in front of patterned surface 54 of wafer 34. Operator 42 looks through eyepiece 46 to inspect the region of wafer 34 within the field of view of objective 52. X-Y stage 30 is operable to move wafer 34 along a vertical plane parallel to surface 22 of rear member 14 so that any location on patterned surface 54 of wafer 34 can be positioned within the field of view of microscope objective 52.

Operator 42 uses keyboard 60 to enter commands that cause X-Y stage 30 to move a desired region of wafer 4 within the field of view of microscope objective 52. Upon completion of an inspection, wafer handler 28 positions paddle structure 72 to remove wafer 34 from X-Y stage 30 and return wafer 34 to its designated slot in storage cassette 26 as shown in FIG. 4A.

FIG. 5 is a diagram of robotic wafer handler 28 for transporting wafer 34 (shown in phantom) between wafer storage cassette 26 and X-Y stage 30. Wafer handler 28 and X-Y stage 30 are of the types manufactured by Kensington Laboratories, Inc. of Richmond, Calif., the assignee of the present application. It will be appreciated that weights provided in a wafer handler designed to counterbalance the force of gravity are not needed in wafer handler 28.

Wafer handler 28 includes a top cylinder 100a that is concentric with and overlaps a base cylinder 100b. Base cylinder 100b extends through and out the rear surface of upright member 14. Top cylinder 100a carries a specimen handling platform 70 on its top side. Top cylinder 100a, together with platform 70, is rotatable about and movable along central axis 76. Wafer handler 28 is characterized, therefore, as having a "waist" between cylinders 100a and 100b. (In FIG. 5, the waist line is obscured within the interior of upright member 14.)

Platform 70 includes a nonrotatable central pedestal 104 that is axially aligned with and movable along central axis 76. A wafer paddle pedestal 106 positioned near the periphery of platform 70 supports paddle structure 72, which includes wafer paddles 74a and 74b. Paddles 74a and 74b are rotatable on wafer paddle pedestal 106 about a paddle axis 78, which is substantially parallel to central axis 76.

Central pedestal 104 includes central vacuum chuck 82 that is axially aligned with central axis 76. A microprocessor-controlled drive mechanism (not shown) included within wafer handler 28 coordinates the rotation of platform 70 about central axis 76 and the rotation of paddles 74a and 74b about paddle axis 78 to achieve the desired movement for transporting wafer 34 between cassette 26 and X-Y stage 30.

For example, wafer handler 28 acquires wafer 34 from storage cassette 26 by positioning wafer paddle 74a behind the wafer. Platform 70 is then moved forward by extending cylinder 100a along axis 76 so that paddle 74a engages wafer 34. Vacuum pressure applied to paddle vacuum chuck 80a in paddle 74a secures wafer 34 to the paddle. Wafer handler 28 moves wafer 34 along a straight-line path 110 from storage cassette 26.

A microprocessor circuit 112 (FIG. 7) controls the drive mechanism that rotates platform 70 about central axis 76 and wafer paddle 74a about paddle axis 78 to form the straight-line path 110. Straight-line path 110 can be achieved, for example, by rotating platform 70 in a clockwise direction while rotating paddle 74a in a counter-clockwise direction at preselected angular speeds.

After it is removed from storage cassette 26 along straight-line path 110, wafer 34 is rotated about paddle axis 78 and positioned in front of central pedestal 104. Wafer 34 is transferred from wafer paddle 74a to central vacuum chuck 82 by the coordinated release of vacuum pressure to paddle vacuum chuck 80a and application of vacuum pressure to central vacuum chuck 82. Since it is able to transport wafer 34 along a straight-line path, wafer handler 28 is compatible for use with standard wafer storage cassettes and processing equipment employed in integrated circuit manufacturing facilities.

One of the tasks wafer handler 28 performs is an edge scan operation to obtain a polar map of the periphery of wafer 34. The polar map data are manipulated in accordance with appropriate algorithms to compute the center and orientation of wafer 34. More specifically, wafer handler 28 performs the edge scan by rotating an optical scanning assembly 114 on platform 70 about the perimeter 116 of wafer 34. Upon completion of the edge scan, wafer handler 28 computes the position and orientation of wafer 34. Wafer handler 28 optionally performs a second scan to read a bar code symbol 118 (outlined in phantom in FIG. 6) positioned on the bottom major surface 120 of wafer 34, in a manner described in copending U.S. patent application No. 07/317,227, filed Feb. 27, 1989, for Method of and Apparatus for Decoding Bar Code Symbols, which is assigned to the assignee of the present application. Wafer handler 28 uses paddle 74a to center and orient wafer 34 so that it can be positioned properly on X-Y stage 30.

Figure 6:
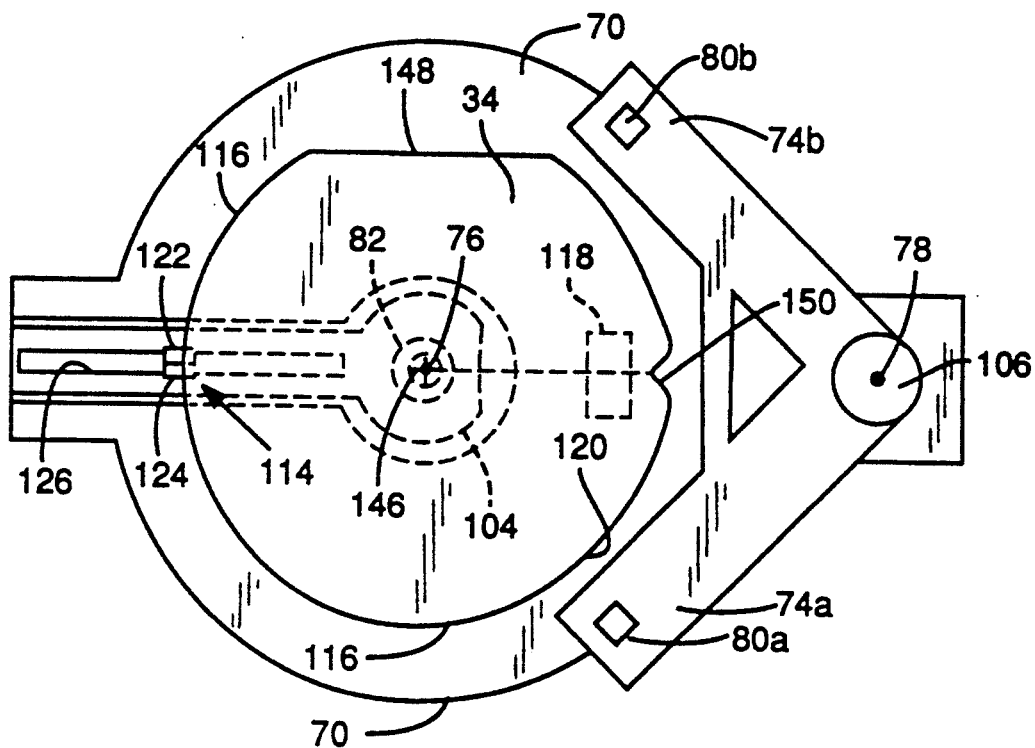
FIG. 6 shows a wafer positioned on the specimen handling platform of the wafer handler shown in FIG. 5.

FIG. 6 is a side elevation view of platform 70 with wafer 34 secured to central vacuum chuck 82. Wafer handler 28 performs an edge scan of wafer 34 by rotating optical scanning assembly 114 about the perimeter 116 of wafer 34, which is held in a fixed position by central vacuum chuck 82. Optical scanning assembly 114 includes a light emitting means or diode 122 and an adjacent photodetector 124 that travel along a rack gear (not shown) positioned behind a slot 126 in platform 70. Slot 126 extends radially from central axis 76 toward the side of platform 70 opposite the side on which paddle pedestal 106 is positioned.

Figure 7:
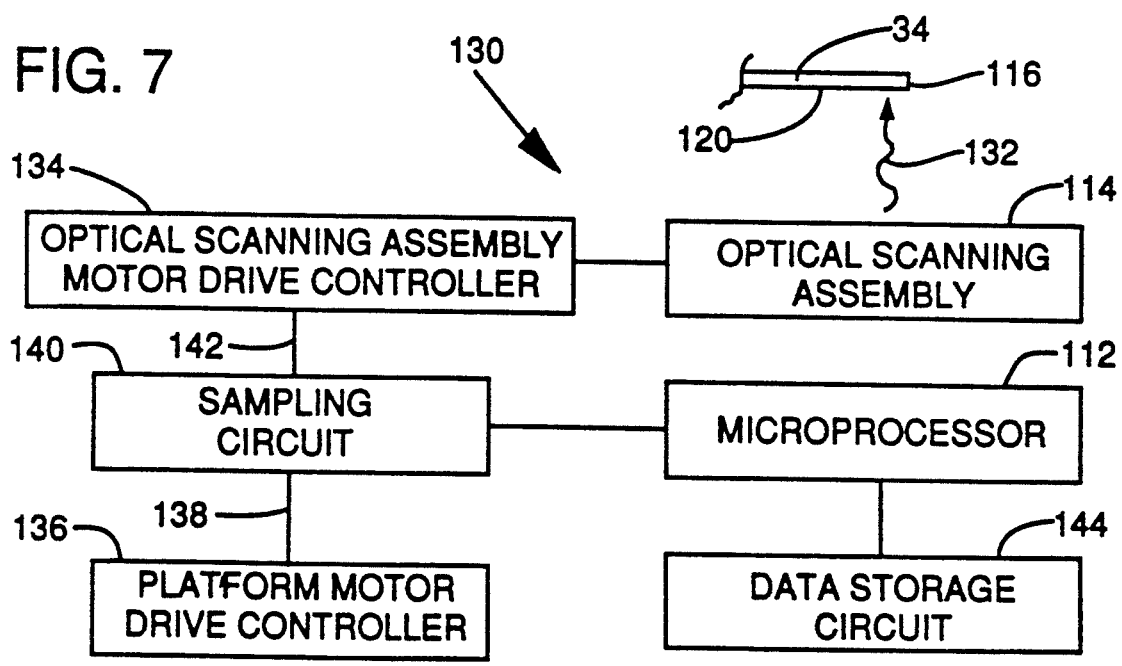
FIG. 7 is a simplified block diagram of a scan data processing system that computes the position and orientation of a wafer to facilitate its delivery to the X-Y stage for inspection.

FIG. 7 is a simplified block diagram of a scan data processing system 130 that cooperates with optical scanning assembly 114 to compute the position and orientation of wafer 34. During the edge scan of wafer 34, light emitting diode 122 of optical scanning assembly 114 directs a light beam 132 of a previously measured maximum intensity toward bottom surface 120 of wafer 34.

Whenever optical scanning assembly 114 is positioned along slot 126 at a radial distance less than that of perimeter 116, substantially all of light beam 132 is reflected toward photodetector 124, which delivers a position feedback signal in a LIGHT state to a scanning assembly motor drive controller 134. In response to the position feedback signal in the LIGHT state, motor drive controller 134 directs a scanning assembly motor (not shown) to rotate the rack gear and increase the radial distance at which optical scanning assembly 114 is positioned, thereby to move optical scanning assembly 114 toward perimeter 116 of wafer 34.

Whenever optical scanning assembly 114 is positioned along slot 126 at a radial distance greater than that of perimeter 116, none of light beam 132 is reflected toward photodetector 124, which delivers a position feedback signal in a NO LIGHT state to scanning assembly motor drive controller 134. In response to the position feedback signal in the NO LIGHT state, motor drive controller 134 directs the scanning assembly motor to rotate the rack gear and reduce the radial distance at which optical scanning assembly 114 is positioned, thereby to move optical scanning assembly toward perimeter 116 of wafer 34.

Whenever optical scanning assembly 114 is positioned along slot 126 at a radial distance aligned with that of perimeter 116, a predetermined portion of light beam 132 is reflected toward photodetector 124, which delivers a position feedback signal in an ALIGNED state to scanning assembly motor drive controller 134. In response to the position feedback signal in the ALIGNED state, motor drive controller 134 maintains the radial distance at which optical scanning assembly 114 is positioned. As a result, the position feedback signal in the ALIGNED state is indicative of the radial position of perimeter 116 of wafer 34. The feedback circuit components are of such values that optical scanning assembly 114 tracks significant changes in the perimeter 116 of wafer 34 over relatively small angular displacements, such as those characteristic of a notch in the wafer.

A platform motor drive controller 136 controls a waist motor that rotates platform 70 and optical scanning assembly 114 about central axis 76. Platform motor drive controller 136 also delivers at regular time intervals a sampling control signal to a control input 138 of a sampling circuit 140. The regular time intervals correspond to unit incremental angular movements (e.g., one arc second, which is approximately 0.003 degrees) of platform 70 and optical scanning assembly 114. The sampling control signal corresponds, therefore, to an angular position of optical scanning assembly 114 relative to wafer 34.

A sample input 142 of sampling circuit 140 receives from scanning assembly motor drive controller 134 a position signal corresponding to the radial position of optical scanning assembly 114 in alignment with perimeter 116. In response to the sampling control signal received from platform motor drive controller 136, sampling circuit 140 samples the position signal delivered to input 142 from scanning assembly motor drive controller 134. The sampling control signal and corresponding position signal correspond, respectively, to the polar coordinates $\theta$ and $r$ of perimeter 116 of wafer 34.

During the edge scan about perimeter 116 of wafer 34, sampling circuit 140 transfers the polar coordinate data to a data storage means or circuit 144. After a complete edge scan about perimeter 116 (i.e., a scan of 360 degrees), data storage circuit 144 contains a complete polar coordinate map representing perimeter 116 of wafer 34.

Microprocessor 112 uses the polar coordinate map stored in data storage circuit 144 to determine the position of the center 146 of wafer 34 relative to central axis 76 and to determine the angular locations of a flat 148 (FIG. 2) and a notch 150 (FIG. 2) on perimeter 116. Flat 148 and notch 150 are standard features on a semiconductor wafer and are indicative of its orientation.

Microprocessor 112 determines the location of center 146, flat 148, and notch 150 of wafer 34 to allow wafer handler 28 to correctly position wafer 34 on X-Y stage 30. Typically, wafer handler 28 repositions wafer 34 so that its center 146 is aligned with central axis 76 prior to movement of wafer 34 to X-Y stage 30. The polar coordinate map stored in data storage circuit 144 also allows wafer handler 28 to read bar code symbol 118 by rotating optical scanning assembly 114 past bar code symbol 118, i.e., during a bar code scan.

An operator-entered or programmed instruction initiates a command sequence within microprocessor 112 that causes wafer handler 28 to maneuver top cylinder 110a and paddle structure 72 to pick up wafer 34 from platform 70 and deliver wafer 34 to X-Y stage 30. During this time, microprocessor 112 provides a signal to X-Y stage 30 to move its upper stage 84 into a docked position (shown in phantom outline in FIG. 4C) to receive wafer 34 over vacuum chuck 86. Microprocessor 112 uses the known position coordinates of the docked upper stage 84 and the previously computed location of flat 148 of the centered wafer 34 to determine a trajectory that will position wafer 34 in the desired location on X-Y stage 30. Microprocessor 112 derives the necessary signals for the drive mechanism that rotates platform 70 and paddle structure 72 to deliver wafer 34 along the computed trajectory path.

During inspection, the operator positions X-Y stage 30 as desired to align selected regions of patterned surface 54 of wafer 34 within the field of view of microscope objective 52. In a preferred embodiment, X-Y stage 30 is of the type in which upper stage 84 is rotatable about and movable along an axis parallel to central axis 76 to, respectively, orient the patterned surface of wafer 34 and achieve a sharp focus with objective 52. Upon completion of an inspection, upper stage 84 returns to its docked position to enable paddle 74b to retrieve wafer 34 and return it to its preassigned slot in storage cassette 26. It will be appreciated that a second wafer secured by vacuum pressure to paddle 74a can be delivered to X-Y stage 30 immediately after paddle 74b retrieves wafer 34 from X-Y stage 30 to thereby enhance wafer inspection throughput.

Figure 8:
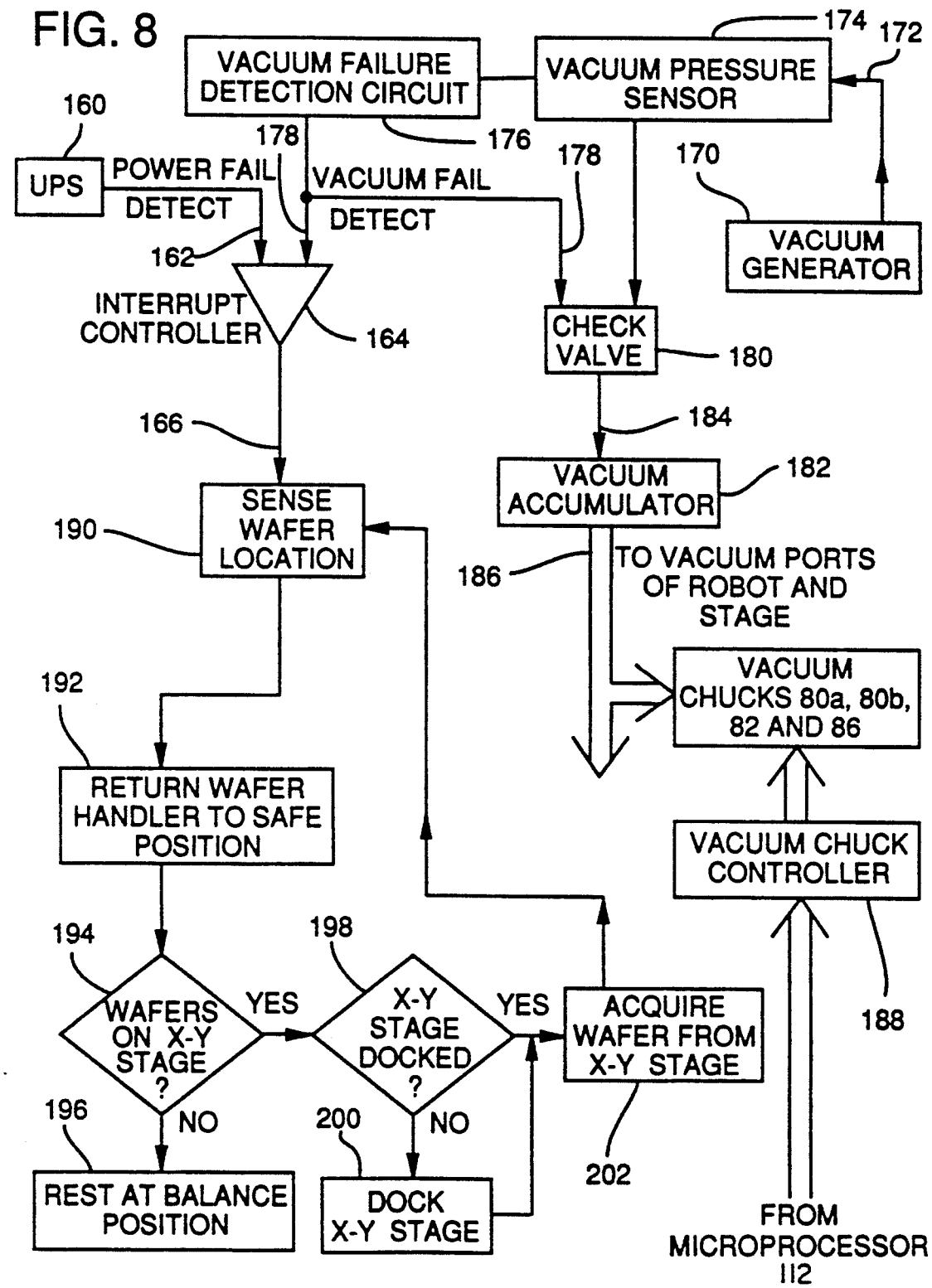
FIG. 8 is a composite block diagram and flow diagram for explaining the operation of the present invention in response to a loss of electrical power or vacuum pressure.

The layout of the wafer storage and transport components of specimen inspection station 10 maintains the patterned surface 54 of wafer 34 in a vertical orientation and, as a consequence, subjects it to gravitational force at all times. Inspection station incorporates, therefore, protection systems that safeguard against the dropping of wafer 34 should a loss of electrical power or vacuum pressure occur. FIG. 8 shows a composite block diagram of certain components of the electrical power and vacuum pressure subsystems of inspection station 10 and a flow diagram indicating the process steps carried out by inspection station 10 in the event of a loss of electrical power or vacuum pressure.

With reference to FIG. 8, inspection station 10 provides to its electrical subsystems the necessary operating voltages from an uninterruptible power supply (UPS) 160 which has an energy storage capability (e.g., a continuously charged auxiliary battery) to maintain for a time output voltages at their nominal levels. UPS 160 is a commercially available device, such as a Model 84130-01, manufactured by Topaz, Inc., San Diego, Calif. UPS 160 provides on an output 162 a signal indicative of whether the primary source for UPS 160 is operational. Output 162 of UPS 160 is connected to a first input of an interrupt controller 164 whose output 166 provides an interrupt signal that commences an interrupt command sequence for operating wafer handler 28 and X-Y stage 30 in the manner described below.

Inspection system 10 delivers to the vacuum chucks of wafer handler 28 and X-Y stage 30 vacuum pressure generated by a vacuum generator 170. Vacuum generator 170 delivers vacuum pressure through a conduit 172 to which a vacuum pressure sensor 174 is connected to monitor the vacuum pressure level. A vacuum failure detection circuit 176 operatively associated with pressure sensor 174 provides on output 178 a signal indicative of a loss of vacuum pressure. The signal on output 178 is delivered to a second input of interrupt controller 164 and to a control input of a check valve 180 positioned within conduit 172. Check valve 180 is connected in series with a vacuum accumulator 182, which has a large volume that functions as a temporary vacuum storage device.

In the event of vacuum pressure loss, a signal present on output 178 of detection circuit 176 closes check valve 180 to provide a high vacuum pressure resistance to the input 184 of accumulator 182. Under these conditions, vacuum pressure stored by accumulator 182 is communicated only through its output manifold 186, which is connected to vacuum chucks 80a, 80b, and 82 of wafer handler 28 and vacuum chuck 86 of X-Y stage 30. The amount of vacuum pressure delivered to each of the vacuum chucks is determined by a vacuum chuck controller 188 in response to signals provided by microprocessor 112.

Whenever it receives a power loss signal on output 162 of UPS 160 or a vacuum loss signal on output 178 of detection circuit 176, interrupt controller 164 initiates the following sequence of operations. Again with reference to FIG. 8, process block 190 indicates that microprocessor 112 determines whether a wafer is present on wafer handler 28 or X-Y stage 30. This determination is accomplished by interrogating the status of the vacuum control demands delivered to vacuum chucks controller 188.

Process block 192 indicates that wafer handler 28 reacts to return to storage cassette 26 any wafer held by paddle 74a or paddle 74b. The required trajectories are readily computed from the known position of the appropriate cassette slot, the present position of the wafer on wafer handler 28, the orientation of paddle structure 72, and the position of top cylinder 100a.

Decision block 194 indicates a determination of whether the determination represented by process block 190 revealed the presence of a wafer on upper stage 84 of X-Y stage 30.

If there is no wafer on X-Y stage 30, process block 196 indicates that top cylinder 100a and paddle structure 72 assume predetermined positions that represent an inherent balance condition for wafer handler 28. The balance condition prevents top cylinder 100a and paddle structure 72 from rotating under the force of gravity in directions that would move paddle structure 72 downwardly toward storage cassette 26, which could be struck and whose contents could be damaged by paddle 74a or 74b.

If there is a wafer on X-Y stage 30, decision block 198 indicates a determination of whether the position coordinates of upper stage 84 of X-Y stage 30 correspond to the docked position, which represents the position that enables wafer handler 28 to acquire a wafer positioned on X-Y stage 30. If X-Y stage 30 is not in the docked position, process block 200 indicates that microprocessor 112 delivers the necessary command to position X-Y stage 30 to the docked position.

Upon docking of X-Y stage 30, process block 202 indicates that wafer handler 28 acquires the wafer held by X-Y stage 30 in the docked position. The flow diagram shows the return to process block 190, which indicates the sensing of the wafer location so that microprocessor 112 can compute the trajectory path required to return the wafer to its slot in storage cassette 26. There will then be no wafer on X-Y stage 30, as determined at decision block 194; and wafer handler 28 will rest at its balanced position, as indicated by process block 196.

The foregoing operations are completed before UPS 160 no longer provides the nominal voltages or accumulator 182 ceases to provide sufficient vacuum to prevent dropping of wafers. It will be appreciated that the resting of wafer handler 28 at its balanced position is unnecessary for a vacuum pressure loss not resulting from an electrical power failure.

It will be obvious to those having skill in the art that many changes may be made to the details of the above-described preferred embodiment of the present invention without departing from the underlying principles thereof. For example, the vertical orientation of the station components readily facilitates an upscaling of the station to accommodate the inspection of very large area specimens, such as liquid crystal displays. The scope of the present invention should, therefore, be determined only by the following claims.

We claim:

1. A specimen inspection station, comprising:
    a specimen storage location for storing a specimen in a generally vertical orientation;
    a stage for supporting the specimen in a generally vertical orientation;
    an automated specimen transporter having a specimen paddle rotatable in a vertical plane for engaging and transporting the specimen from the specimen storage location to the stage; and
    an optical means for viewing a selected region of the generally vertically oriented specimen supported on the stage.

2. The station of claim 1 in which the stage is translatable in a generally vertical plane to selectively present different regions of the specimen to the optical means.

3. The station of claim 1 in which a specimen storage cassette is located at the specimen storage location, and the specimen storage cassette, the stage, and the specimen transporter are supported by a vertically oriented planar support surface.

4. The station of claim 1 further comprising a vacuum pressure source for supplying vacuum to the specimen transporter and stage to secure the specimen in a generally vertical orientation as the specimen is transported to and supported by the stage.

5. The station of claim 1 in which the optical means includes an objective lens through which an observer can observe the selected region, and the objective lens is located a horizontal distance away form the selected region of the specimen.

6. A specimen inspection station, comprising:
a stage for supporting a specimen in a generally vertical orientation;
a specimen transporter for transporting the specimen from a specimen storage location to the stage, the specimen transporter including a paddle that is operable t acquire the specimen from the specimen storage location and transport the specimen int he generally vertical orientation by means of rotational movement to the stage;
an optical means for viewing a selected region of the generally vertically oriented specimen supported on the stage; and
a vacuum pressure source for supplying vacuum to the paddle and the stage to secure the specimen to the paddle during transportation of the specimen from the specimen storage location to the stage and to secure the specimen to the stage.

7. A specimen inspection station, comprising:
a stage for supporting a specimen in a generally vertical orientation;
a vacuum pressure source communicating with the stage to secure the specimen in the generally vertical orientation to the stage;
a vacuum pressure level sensor for detecting a decrease in vacuum pressure delivered to the stage; and
a specimen transporter responsive to a detection of a vacuum pressure decrease for retrieving the specimen from the stage and storing the specimen to prevent damage to it.

8. The station of claim 7 in which the specimen transporter transports and stores the specimen in a generally vertical orientation.

9. The station of claim 7, further comprising optical means for viewing a selected region of the generally vertically oriented specimen secured to the stage.

10. The station of claim 11 in which the vacuum pressure source additionally communicates with the specimen transporter and includes an accumulator capable of maintaining vacuum pressure to the state and the specimen transporter to allow the specimen transporter to store the specimen in the event of a decrease in vacuum pressure.

11. A method for inspecting a specimen comprising the steps of:
storing a plurality of specimens in a generally vertical orientation and in a generally aligned relationship at a storage location;
using the automated transport mechanism to transport a specimen from the storage location to an inspection location;
supporting the specimen in a generally vertical orientation at the inspection location by applying vacuum pressure to a support stage;
inspecting the generally vertically oriented specimen by presenting at least one selected region of the specimen to an optical means;
detecting a decrease in vacuum pressure to the support stage; and
storing the specimen upon detection of a decrease in vacuum pressure to prevent damage to the specimen.

12. A method for inspecting a specimen comprising the steps of:
storing a plurality of specimens in a generally vertical orientation and in a generally parallel, stacked relationship at a storage location;
transporting a selected specimen from the storage location to an inspection location using an automated specimen transporter rotatable in a vertical plane;
supporting the specimen in a generally vertical orientation tat the inspection location on a support stage; and
inspecting the generally vertically oriented specimen by presenting at least one selected region of the specimen to an optical means for viewing.

13. A method according to claim 12, additionally comprising the step of optically scanning the specimen to determine the location of a specimen center and a specimen flat edge portion.

14. A method according to claim 12, additionally comprising the step of translating the support stage in relation to the optical means to present multiple selected regions of the specimen to the optical means for viewing.

15. A method according to claim 12, in which the transporting step involves engaging the specimen on a first paddle, rotating the first paddle, transferring the specimen to a second paddle, and rotating the second paddle to deliver the specimen to the support stage.

16. A specimen inspection station, comprising:
a specimen stage for supporting a specimen in a generally vertical orientation;
a specimen transporter for transporting a specimen from a storage location to the specimen stage, the specimen transporter having a rotatable paddle capable of contacting and securing a specimen located at a specimen storage location and transporting the specimen tot eh specimen stage using rotation in a plane generally parallel to the plane of the stage; and
an optical means for viewing a selected region of a specimen mounted on the stage, the specimen stage being movable relative to the optical means to permit viewing of selected regions of the specimen.

17. The specimen inspection station of claim 16 in which the specimen transporter additionally comprises a rotatable specimen handling platform to which the paddle is rotatably mounted, whereby the handling platform and paddle are independently rotatable.

18. The specimen inspection station of claim 16, further comprising a specimen handling platform, said platform being translatable to position the paddle for contact with a predetermined specimen.

19. The specimen inspection station of claim 16, additionally comprising an optical scanner for determining the location of a specimen center and a specimen flat edge portion.

20. The specimen inspection station of claim 16 in which the specimen transporter has two independently rotatable paddles.

* * * * *